(12) United States Patent
Huang et al.

(10) Patent No.: US 12,119,420 B2
(45) Date of Patent: Oct. 15, 2024

(54) METHOD FOR MANUFACTURING PHOTOVOLTAIC MODULE AND PHOTOVOLTAIC MODULE

(71) Applicant: JINKO SOLAR (HAINING) CO., LTD., Haining (CN)

(72) Inventors: Shiliang Huang, Haining (CN); Zhiqiu Guo, Haining (CN); Yingli Guan, Haining (CN); Jingguo Yang, Haining (CN)

(73) Assignee: JINKO SOLAR (HAINING) CO., LTD., Haining (CN)

( * ) Notice: Subject to any disclaimer, the term of this patent is extended or adjusted under 35 U.S.C. 154(b) by 0 days.

(21) Appl. No.: 18/490,663

(22) Filed: Oct. 19, 2023

(65) Prior Publication Data
US 2024/0178334 A1    May 30, 2024

(30) Foreign Application Priority Data
Nov. 24, 2022    (CN) .......................... 202211481197.6

(51) Int. Cl.
*H01L 31/048*    (2014.01)
*H01L 31/05*    (2014.01)

(52) U.S. Cl.
CPC ........ *H01L 31/048* (2013.01); *H01L 31/0504* (2013.01)

(58) Field of Classification Search
CPC . H01L 31/048; H01L 31/0481; H01L 31/049; H01L 31/18
See application file for complete search history.

(56) References Cited

U.S. PATENT DOCUMENTS

2009/0101197 A1*  4/2009  Morikawa ....... H01L 31/022458
                                                       136/252
2012/0103388 A1    5/2012  Meakin et al.
(Continued)

FOREIGN PATENT DOCUMENTS

CN        102738310 A    10/2012
CN        104752560 B    1/2017
(Continued)

OTHER PUBLICATIONS

J Govaerts, et al, "The i-module approach: Towards improved performance and reliability of photovoltaic modules", 18th European Microelectronics and Packaging Conference (EMPC), Sep. 12, 2011, 5 pgs.
(Continued)

*Primary Examiner* — Angelo Trivisonno
(74) *Attorney, Agent, or Firm* — USCH Law, PC

(57) ABSTRACT

A method for manufacturing a photovoltaic module and a photovoltaic module are provided. The method includes: laying a front plate, a first adhesive layer on the front plate, and a plurality of cells on the first adhesive layer, and pre-curing the first adhesive layer between the front plate and the plurality of cells; forming a plurality of cell strings by connecting the plurality of cells through a plurality of solder strips after the first adhesive layer is pre-cured; and laying a second adhesive layer on the plurality of cell strings, laying a back plate on the second adhesive layer, and curing the second adhesive layer between the back plate and the plurality of cell strings, to form the photovoltaic module.

14 Claims, 6 Drawing Sheets

(56) References Cited

U.S. PATENT DOCUMENTS

2012/0298172 A1    11/2012   Baert
2017/0077332 A1*    3/2017   Sethi ..................... B32B 27/08

FOREIGN PATENT DOCUMENTS

| CN | 107492581 A | 12/2017 |
| CN | 111863991 A | 10/2020 |
| CN | 112968075 A | 6/2021 |
| CN | 113314637 A | 8/2021 |
| CN | 113611763 A | 11/2021 |
| CN | 215418196 U | 1/2022 |
| CN | 114899274 A | 8/2022 |
| CN | 217485460 U | 9/2022 |
| DE | 102007035883 A1 | 2/2009 |
| EP | 2575184 A2 | 4/2013 |
| JP | 2012094742 A | 5/2012 |
| JP | 2013524543 A | 6/2013 |
| JP | 2016525791 A | 8/2016 |
| JP | 2017513228 A | 5/2017 |
| JP | 2022073832 A | 5/2022 |
| WO | 2017043518 A1 | 3/2017 |
| WO | 2020100528 A1 | 5/2020 |

OTHER PUBLICATIONS

M Kontge, et al, "A novel photovoltaic-module assembly system for back contact solar cells using laser soldering technique", 23rd European Photovoltaic Solar Energy Conference, Sep. 1, 2008, 4 pgs.

J Govaerts, et al, "A Novel Concept for Advanced Modules with Back-Contact Solar Cells", 25th European Photovoltaic Solar Energy Conference and Exhibition, Sep. 6, 2020, 4 pgs.

J Shan, et al, "Encapsulation of PV Modules Using Ethylene Vinyl Acetate Copolymer as the Encapsulant", Macromolecular Reaction Engineering, vol. 9, No. 5, Mar. 27, 2015, 8 pgs.

Kagroui, et al, "Thermal stability of slow and fast cure EVA encapsulant material for photovoltaic module manufacturing process", Solar Energy Materials and Solar Cells, vol. 90, No. 15, Sep. 22, 2006, 6 pgs.

J P Galica, et al, "Development of low cost faster-curing encapsulants for terrestrial PV modules", 16th European Photovoltaic Solar Energy Conference, May 1, 2000, 4 pgs.

Jinko Solar (Haining) Co., Ltd., Extended European Search Report, EP 23205211.8, Mar. 18, 2024, 13 pgs.

* cited by examiner

METHOD FOR MANUFACTURING PHOTOVOLTAIC MODULE AND PHOTOVOLTAIC MODULE

CROSS REFERENCE TO RELATED APPLICATIONS

The present application claims the benefit of priority under the Paris Convention to Chinese Patent Application No. 202211481197.6 filed on Nov. 24, 2022, which is incorporated herein by reference in its entirety.

TECHNICAL FIELD

The various embodiments described in this document relate in general to the technical field of photovoltaics, and more specifically to a method for manufacturing a photovoltaic module and the photovoltaic module.

BACKGROUND

It is one of important ways to improve conversion efficiency of the cells by changing positions and structures of electrodes of the cell to reduce shielding of front electrodes and conductive solder strips and to develop back-contact cells. At present, there are two main types of industrialized back-contact cells, where one type of the cells adopts the metal wrap through (MWT) technology. Although the MWT technology can help to improve the conversion efficiency of the cells, the highest conversion efficiency in industrialization is less than 20% at present. Since the surface shielding of the MWT cell may not be completely eliminated, it is difficult to continue improve cell efficiency. The other type of the cells adopts interdigitated back contact (IBC) technology, which can make the surface of the cell without any electrodes and conductive solder strips, and completely eliminate the shielding of electrodes and conductive solder strips on the surface of the cell. In other words, for IBC cells, positive and negative electrodes are all arranged on the back side of the cell, and electrodes in contact with emitting regions are interleaved with electrodes in contact with base regions, so that the whole surface of the cell can receive illumination, and collect photo-generated carriers more effectively, thereby greatly improving the energy conversion efficiency. The IBC cell has achieved the highest conversion efficiency of 24.2% in industrialization, which ranks first among all industrialized crystalline silicon cells, and thus, the IBC cell is an important direction for the development of high-efficiency cells in the future.

SUMMARY

In view of the above, embodiments of the disclosure provide a method for manufacturing a photovoltaic module, including the following: laying a front plate, a first adhesive layer on the front plate, and a plurality of cells on the first adhesive layer, and pre-curing the first adhesive layer between the front plate and the plurality of cells; forming a plurality of cell strings by connecting the plurality of cells through a plurality of solder strips after the first adhesive layer is pre-cured; and laying a second adhesive layer on the plurality of cell strings, laying a back plate on the second adhesive layer, and curing the second adhesive layer between the back plate and the plurality of cell strings, to form the photovoltaic module.

In some embodiments, at least one of the first adhesive layer and the second adhesive layer is glue or an encapsulation adhesive film.

In some embodiments, laying the front plate, the first adhesive layer on the front plate, and the plurality of cells on the first adhesive layer, pre-curing the first adhesive layer, laying the second adhesive layer on the plurality of cell strings, laying the back plate on the second adhesive layer, and curing the second adhesive layer includes: in response to the first adhesive layer and the second adhesive layer being glue, printing glue on a side of the front plate close to the plurality of cells, laying the plurality of cells on the glue, and pre-curing the glue between the front plate and the plurality of cells; and printing glue on the plurality of cell strings, and laying the back plate on the glue, and curing the glue between the plurality of cell strings and the back plate; or in response to the first adhesive layer being glue and the second adhesive layer being an encapsulation adhesive film, printing glue on the side of the front plate close to the plurality of cells, laying the plurality of cells on the glue, and pre-curing the glue between the front plate and the plurality of cells; and laying a back encapsulation adhesive film on the plurality of cell strings and laying the back plate on the back encapsulation adhesive film, and laminating the front plate, the plurality of cell strings, the back encapsulation adhesive film, and the back plate that are stacked.

In some embodiments, the glue has a thickness in a range of not less than 0.1 mm in a direction perpendicular to the front plate.

In some embodiments, pre-curing the glue between the front plate and the plurality of cells includes heating curing, a temperature for the heating curing ranges from 100° ° C. to 200° C., and a time for the heating curing ranges from 5 min to 30 min.

In some embodiments, laying the front plate, the first adhesive layer on the front plate, and the plurality of cells on the first adhesive layer, pre-curing the first adhesive layer, laying the second adhesive layer on the plurality of cell strings, laying the back plate on the second adhesive layer, and curing the second adhesive layer includes: in response to the first adhesive layer and the second adhesive layer are both encapsulation adhesive films, laying a front encapsulation adhesive film on a side of the front plate close to the plurality of cells, laying the plurality of cells on the front encapsulation adhesive film, and pre-laminating the front plate, the front encapsulation adhesive film, and the plurality of cells that are stacked; and laying a back encapsulation adhesive film on the plurality of cell strings, laying the back plate on the back encapsulation adhesive film, and laminating the front plate, the plurality of cell strings, the back encapsulation adhesive film, and the back plate that are stacked; or in response to the first adhesive layer being an encapsulation adhesive film and the second adhesive layer being glue, laying a front encapsulation adhesive film on the side of the front plate close to the plurality of cells, laying the plurality of cells on the front encapsulation adhesive film, and laminating the front plate, the front encapsulation adhesive film, and the plurality of cells that are stacked; and printing the glue on the plurality of cell strings, laying the back plate on the glue, and curing the glue between the plurality of cell strings and the back plate.

In some embodiments, a time for the pre-laminating the front plate, the front encapsulation adhesive film, and the plurality of cells that are stacked is not more than 10 min, and a temperature for the pre-laminating is not more than 140° C.

In some embodiments, a time for the laminating the front plate, the plurality of cell strings, the back encapsulation adhesive film, and the back plate that are stacked is in a range of 10 min to 20 min, and a temperature for the laminating is in a range of 140° C. to 160° C.

In some embodiments, a photovoltaic module is provided. The photovoltaic module is manufactured by the method described in any embodiment of the disclosure and includes: the front plate, the first adhesive layer disposed on the front plate, the plurality of cell strings disposed on the first adhesive layer, the second adhesive layer disposed on the plurality of cell strings, and the back plate disposed on the second adhesive layer. Each respective cell string of the plurality of cell strings comprises at least two cells of the plurality of cells, and each two adjacent cells in the respective cell string are connected using at least one respective solder strip of the plurality of solder strips; and at least one of the first adhesive layer and the second adhesive layer is glue or an adhesive film.

In some embodiments, each cell of the plurality of cells is a back-contact cell, and the at least one respective solder strip is connected to a back surface of each cell of the two adjacent cells in the respective cell string.

In some embodiments, the glue has an area greater than or equal to a total area of the plurality of cell strings, and/or the adhesive film has an area greater than or equal to a total area of the plurality of cell strings.

BRIEF DESCRIPTION OF THE DRAWINGS

The accompanying drawings, which are incorporated in and form a part of the specification, illustrate embodiments of the disclosure and, together with the description thereof, serve to explain the principles of the disclosure.

DETAILED DESCRIPTION OF THE EMBODIMENTS

Figure 1:
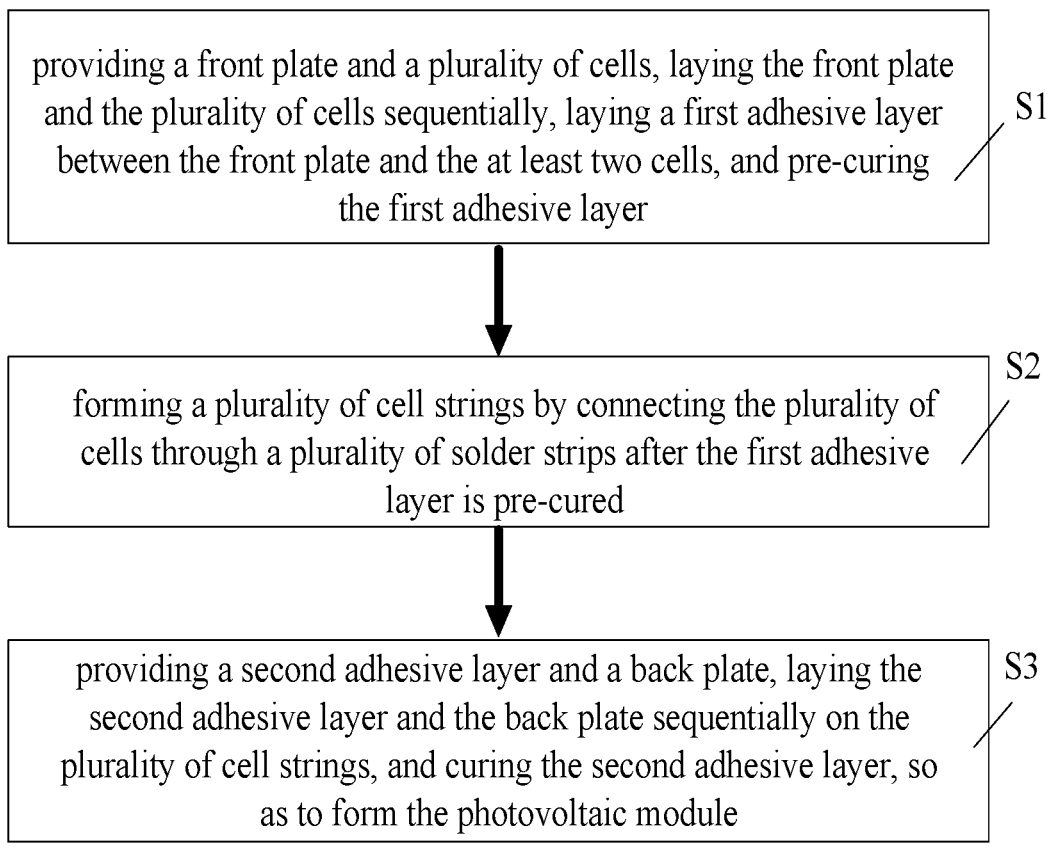
FIG. 1 is a flow chart of a method for manufacturing a photovoltaic module according to embodiments of the disclosure.

Various exemplary embodiments of the disclosure will now be described in detail with reference to the accompanying drawings. It is to be noted that the relative arrangement, numeric expressions, and numerical values of the components and steps set forth in these embodiments do not limit the scope of the disclosure unless otherwise specified.

The following description of at least one exemplary embodiment is in fact illustrative only and is in no way intended to limit the disclosure and its application or use.

Techniques, methods, and devices known to those of ordinary skill in the relevant art may not be discussed in detail, but where appropriate, such techniques, methods, and devices should be regarded as part of the specification.

In all examples shown and discussed herein, any specific value should be interpreted as illustrative only and not as a limitation. Therefore, other examples of exemplary embodiments may have different values.

It is to be noted that like numerals and letters denote like terms in the following drawings, and therefore, once an item is defined in one drawing, the item does not need to be further discussed in subsequent drawings.

For conventional cells, due to welding of the solder strips on the front and back sides of the cell, the welding stress may be cancelled. However, for back-contact cells, since positive electrodes and negative electrodes of the cell are all located on the back side of the cell, when conventional solder strips are welded on the back side, welding stress may exist in the back-contact cell (i.e., the welding stress may not be cancelled through the front and back welding), which may lead to cell warpage. The warpage of the back-contact cell easily leads to cracks and fragments of the back-contact modules in the subsequent process, which seriously affects the yield of the back contact modules and leads to an increase in manufacturing cost.

Therefore, it is desired to provide a method for manufacturing a photovoltaic module and the photovoltaic module, which can prevent the cell from warping due to stress caused by single-side welding (only welding on the back side of the cell), thereby avoiding the risk of cracking and fragmentation of the cell, and further improving the yield of the photovoltaic module.

Compared with the related technologies, the method for manufacturing a photovoltaic module and the photovoltaic module at least achieve following beneficial effects.

According to the method for manufacturing a photovoltaic module and the photovoltaic module provided in embodiments of the disclosure, the method includes the following: laying the front plate and the plurality of cells sequentially, laying a first adhesive layer between the front plate and the plurality of cells, and pre-curing the first adhesive layer; forming a plurality of cell strings by connecting the plurality of cells through a plurality of solder strips after the first adhesive layer is pre-cured; and laying the second adhesive layer and the back plate sequentially on the plurality of cell strings, and curing the second adhesive layer, so as to form the photovoltaic module. In the above scheme, before the cells are connected in series, the first adhesive layer is pre-cured to prevent the cells from warping due to stress caused by single-side welding, thereby avoiding the risk of cracking and fragmentation of the cells and further improving the yield of the photovoltaic module.

Any product implementing the utility model does not need to achieve all the technical effects mentioned above at the same time.

Other features and advantages of the utility model will become apparent from the following detailed description of exemplary embodiments of the utility model with reference to the accompanying drawings.

FIG. 1 is a flow chart of a method for manufacturing a photovoltaic module according to embodiments of the disclosure. Referring to FIG. 1, the embodiments provide a method for manufacturing the photovoltaic module. The method begins at S1.

At S1, a front plate and a plurality of cells are provided, and laid sequentially. A first adhesive layer is laid between the front plate and the plurality of cells, and the first adhesive layer between the front plate and the plurality of cells is pre-cured.

Specifically, the front plate is laid, the first adhesive layer is laid on the front plate, the plurality of cells are laid on the first adhesive layer. The first adhesive layer between the front plate and the plurality of cells is pre-cured.

At S2, after the first adhesive layer is pre-cured, the plurality of cells are connected through a plurality of solder strips to form a plurality of cell strings.

Specifically, after the first adhesive layer is pre-cured, each respective cell string of the plurality of cell strings is formed by connecting a respective subset of the plurality of cells using at least one respective solder strip of the plurality of solder strips.

At S3, a second adhesive layer and a back plate are provided and sequentially laid on the plurality of cell strings, and the second adhesive layer between the back plate and the plurality of cell strings is cured, so as to form the photovoltaic module.

Specifically, the second adhesive layer is laid on the plurality of cell strings, the back plate is laid on the second adhesive layer, and the second adhesive layer between the back plate and the plurality of cell strings is cured, such that the photovoltaic module is formed.

Specifically, the method for manufacturing the photovoltaic module includes following operations. In operations at S1, the front plate and the plurality of cells are provided. The front plate includes flexible or rigid materials with high light transmittance. For example, the front plate can be any one of polyethylene terephthalate (PET), tempered glass, ethylene-tetrafluoroethylene copolymer (ETFE), or a transparent fluorine-containing film. The front plate has an air side and a cell side opposite to the air side (the cell side is a side of the front plate where the cells are placed). During laying normally, the air side of the front plate faces down, and then the plurality of cells are laid, where the plurality of cells are arranged in a matrix. In addition, the first adhesive layer is laid between the front plate and the plurality of cells, where the first adhesive layer can be glue or an encapsulation adhesive film. The first adhesive layer between the front plate and the plurality of cells is pre-cured to ensure that the plurality of cells are fixed on the front plate.

In operations at S2, after the first adhesive layer is pre-cured, the plurality of cells are connected through the plurality of solder strips to form the plurality of cell strings. Specifically, series connection between cells and between cell strings are realized through the plurality of solder strips to realize internal series connection.

It is to be noted that the cell strings being connected in series is merely illustrative and the plurality of cell string can be connected in series and/or connected in parallel, so as to form the photovoltaic module.

In operations at S3, the second adhesive layer and the back plate are provided, where the second adhesive layer can be glue or an encapsulation adhesive film. The back plate is located on the back side of the photovoltaic module to protect and support the cells and has reliable insulation, water resistance, and aging resistance. The second adhesive layer and the back plate are sequentially laid on the plurality of cell strings, and then the second adhesive layer is subjected to curing, such that the photovoltaic module is formed.

According to foregoing embodiments, the method for manufacturing the photovoltaic module provided in embodiments at least achieves the following beneficial effects.

In the method for manufacturing the photovoltaic module provided in the embodiments, the front plate and the plurality of cells are laid in sequence, the first adhesive layer is laid between the front plate and the cells, and the first adhesive layer is pre-cured. After the first adhesive layer is pre-cured, the plurality of cells are connected through the plurality of solder strips to form the plurality of cell strings. The second adhesive layer and the back plate are sequentially laid on the series-connected cell strings, and the second adhesive layer between the back plate and the cells is cured, such that the photovoltaic module is formed. In the above scheme, before the cells are connected in series, the first adhesive layer is pre-cured to prevent the cells from warping due to stress caused by single-side welding, thereby avoiding the risk of cracking and fragmentation of the cells and further improving the yield of the photovoltaic modules.

In some embodiments, when both the first adhesive layer and the second adhesive layer are glue, glue is first printed on a side of the front plate close to the plurality of cells, then the plurality of cells are laid on the glue, and the glue between the front plate and the plurality of cells is pre-cured. Thereafter, the glue is printed on the plurality of cell strings, and after the back plate is laid on the glue, the glue between the plurality of cell strings and the back plate is cured.

Alternatively, when the first adhesive layer is glue and the second adhesive layer is an encapsulation adhesive film, the glue is first printed on a side of the front plate close to the plurality of cells, then the plurality of cells are laid on the glue, and the glue between the front plate and the plurality of cells is pre-cured. Thereafter, a back encapsulation adhesive film is laid on the plurality of cell strings and the back plate is laid on the back encapsulation adhesive film, and the front plate, the plurality of cell strings, the back encapsulation adhesive film, and the back plate that are stacked are laminated.

Figure 2:
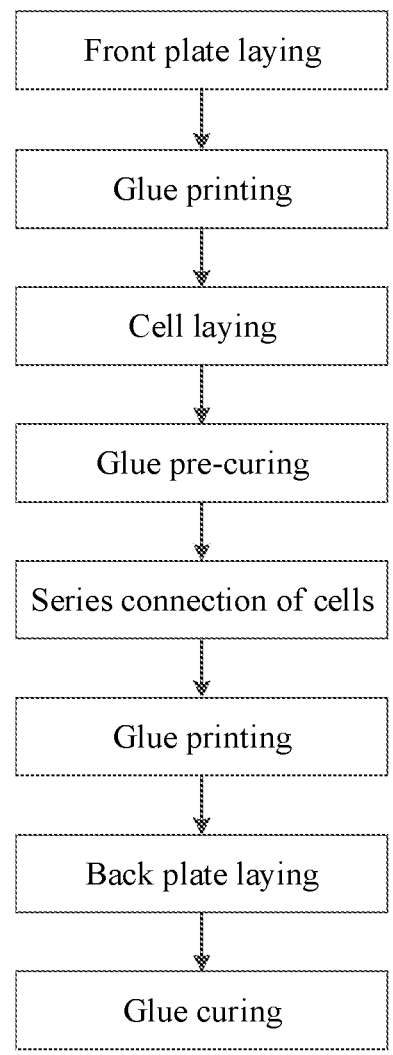
FIG. 2 is a flow chart of a method for manufacturing a photovoltaic module according to other embodiments of the disclosure.

Specifically, FIG. 2 is a flow chart of a method for manufacturing a photovoltaic module according to other embodiments of the disclosure. Referring to FIG. 2, both the first adhesive layer and the second adhesive layer are glue. During laying normally, the air side of the front plate is first facing down, and then the glue is sprayed or printed on the cell side of the front plate. Specifically, a light-receiving surface of each respective cell of the plurality of cells is laid flat on a surface of the glue, i.e., the respective cell is not in contact with the front plate. In addition, the respective cell partially inserts into the glue, but the glue does not go over a back surface of the respective cell. Thereafter, the glue between the front plate and the plurality of cells is cured by ultraviolet lamp irradiation or heating to complete pre-positioning of the respective cell. The glue between the front plate and the plurality of cells can be cured by either photo-curing or thermal-curing. For example, the photo-curing can be ultraviolet (UV) curing, and the UV curing is performed by using a UV lamp with a wavelength of 365 nm and a curing time for the UV curing is in a range of 1 s to 60 s, such as 1 s, 15 s, 30 s, 45 s, or 60 s. Alternatively, the thermal-curing can be heating curing. A temperature for the heating curing is in a range of 100° C.-200° ° C., such as 100° C., 120° C., 140° C., 160° C., 180° C., or 200° C., and a time for the heating curing is in a range of 5 min to 30 min, such as 5 min, 10 min, 20 min, or 30 min. Thereafter, each respective subset of the cells are connected by using at least one respective solder strip of the plurality of solder strips to form a respective cell string of the plurality of cell strings and then the plurality of cell strings are connected in series through solder strips to realize internal series connection. Thereafter, another layer of glue is sprayed on the cells connected in series to ensure that the glue goes over a surface of a respective solder strip of the plurality of solder strips. Finally, the back plate is laid on the glue, and encapsulating of the photovoltaic module is completed through photo-curing or thermal-curing. For example, the photo-curing can be UV curing, and the UV curing adopts an UV lamp with a wavelength of 365 nm, and a curing time for the UV curing may be 1 s to 30 s, such as 1 s, 10 s, 20 s, or 30 s. Alternatively, the thermal-curing can be heating curing. A temperature for the heating curing may range from 100° C. to 200° C., such as 100° ° C., 120° C., 140° C., 160° C., 180° C., or 200° ° C., and a time for the heating curing may range from 6 min to 40 min, such as 6 min, 10 min, 20 min, 30 min, or 40 min. It is to be noted that if the heating curing is adopted, the temperature for the heating curing is inversely proportional to the time for the heating curing. For example, if the temperature for the heating curing is relatively high, the time for the heating curing may be shortened. Alternatively, if the temperature for the heating curing is relatively low, the time for the heating curing may be prolonged. In addition, the time for the heating curing during pre-positioning of the cells can be shorter than the time for the heating curing after the back plate is laid.

Figure 4:
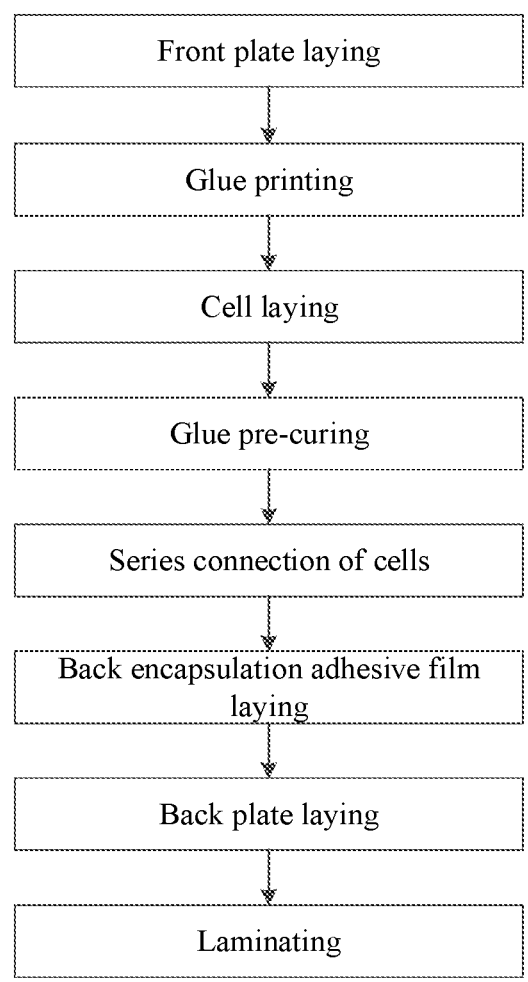
FIG. 4 is a flow chart of a method for manufacturing a photovoltaic module according to other embodiments of the disclosure.

FIG. 4 is a flow chart of a method for manufacturing a photovoltaic module according to other embodiments of the disclosure. Referring to FIG. 4, the first adhesive layer is glue and the second adhesive layer is an encapsulation adhesive film. The air side of the front plate is first facing down, and then the glue is sprayed or printed on the cell side of the front plate. Specifically, a light-receiving surface of each respective cell of the plurality of cells is laid flat on a surface of the glue, i.e., the respective cell is not in contact with the front plate. In addition, the respective cell partially inserts into the glue, but the glue does not go over a back surface of the respective cell. Thereafter, the glue between the front plate and the plurality of cells is cured by ultraviolet lamp irradiation or heating to complete pre-positioning of the respective cell. The glue between the front plate and the plurality of cells can be cured by either photo-curing or thermal-curing. For example, the photo-curing can be UV curing, and the UV curing is performed by using a UV lamp with a wavelength of 365 nm and a curing time for the UV curing is in a range of 1 s to 60 s, such as 1 s, 15 s, 30 s, 45 s, or 60 s. Alternatively, the thermal-curing can be heating curing. A temperature for the heating curing is in a range of 100° C. to 200° ° C., such as 100° C., 120° C., 140° C., 160° ° C., 180° C., or 200° C., and a time for the heating curing is in a range of 5 min to 30 min, such as 5 min, 10 min, 20 min, or 30 min. Thereafter, the cells arranged in the matrix are connected through solder strips to realize internal series connection. A back encapsulation adhesive film is laid on the cells connected in series, and the back plate is laid on the back encapsulation adhesive film. Finally, the encapsulating of the modules is realized by laminating, and a time for the laminating is in a range of 15 min to 25 min, such as 15 min, 18 min, 21 min, or 25 min. A temperature for the laminating ranges from 140° ° C. to 160° C., such as 140° C., 145° C., 150° C., 155° C., or 160° C.

It is to be noted that a thickness of the glue between the front plate and the plurality of cells is not less than 0.1 mm in a direction perpendicular to the front plate. If the thickness of the glue is less than 0.1 mm in the direction perpendicular to the front plate, the glue is too thin to bond the front plate and the cells. If the thickness of the glue in the direction perpendicular to the front plate is greater than 0.5 mm, the cost may be too high. Therefore, the thickness of the glue between the front plate and the plurality of cells in the direction perpendicular to the front plate is designed to be in a range of 0.1 mm to 0.5 mm, which can avoid too thin glue laying, effectively bond the front plate and the cells, and further reduce the cost. Specifically, in the direction perpendicular to the front plate, the thickness of the glue between the front plate and the plurality of cells can be 0.1 mm, 0.2 mm, 0.3 mm, 0.4 mm, or 0.5 mm.

The light transmittance of the glue is greater than or equal to (≥) 85%, which effectively ensures that the cells receive sunlight.

In the above scheme, glue pre-curing (i.e., the pre-curing of the glue between the front plate and the plurality of cells) can prevent the cells from warping due to stress caused by single-side welding, thus avoiding the risk of cracking and fragmentation of the cells, and further improving the yield of photovoltaic modules.

In some embodiments, when both the first adhesive layer and the second adhesive layer are encapsulation adhesive films, a front encapsulation adhesive film is laid on the side of the front plate close to the cells, then the cells are laid on the front encapsulation adhesive film, and the front plate, the front encapsulation adhesive film, and the cells that are stacked are pre-laminated. A back encapsulation adhesive film is laid on the plurality of cell strings and a back plate is laid on the back encapsulation adhesive film. The front plate, the cell strings, the back encapsulation adhesive film, and the back plate that are stacked are laminated.

Alternatively, when the first adhesive layer is an encapsulation adhesive film and the second adhesive layer is glue, a front encapsulation adhesive film is laid on the side of the front plate close to the cells, then the cells are laid on the front encapsulation adhesive film, and the front plate, the front encapsulation adhesive film, and the cells that are stacked are laminated. After glue is printed on the cell strings, the back plate is laid on the glue, and then the glue between the plurality of cell strings and the back plate is cured.

Figure 3:
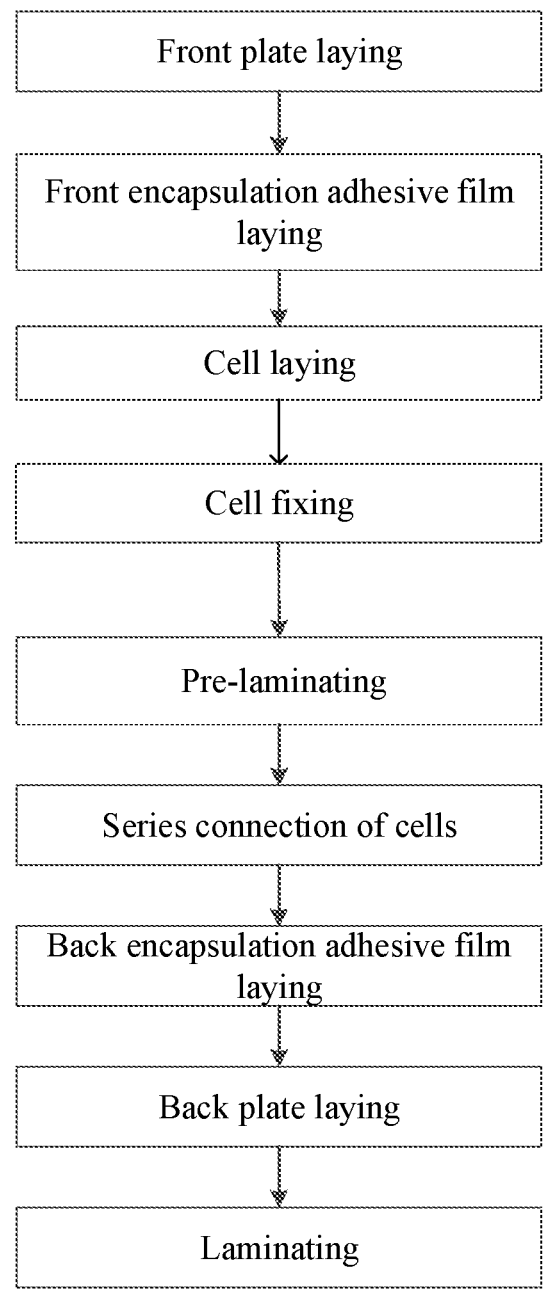
FIG. 3 is a flow chart of a method for manufacturing a photovoltaic module according to other embodiments of the disclosure.

Specifically, FIG. 3 is a flow chart of a method for manufacturing a photovoltaic module according to other embodiments of the disclosure. Referring to FIG. 3, when both the first adhesive layer and the second adhesive layer are encapsulation adhesive films, the encapsulation adhesive film may be an ethylene-vinyl acetate copolymer (EVA) adhesive film, a polyethylene octene co-elastomer (POE) adhesive film, or a polyvinyl butyral (PVB) adhesive film. The main component of the EVA adhesive film includes EVA, a small amount of crosslinking agent, auxiliary crosslinking agent, anti-aging agent, and other functional additives. The EVA is prepared by copolymerization of two monomers, and the ethylene chains are relatively stable. The POE adhesive film includes saturated fatty chain and has the characteristics of good weather resistance, ultraviolet aging resistance, excellent heat resistance, and low temperature resistance, wide application temperature range, good light transmittance, excellent electrical insulation performance, low cost, and is easy to process. The PVB adhesive film belongs to thermoplastic resin, has no crosslinking reaction, can be repeated processing, and also has weather resistance. During laying normally, the air side of the front plate is facing down, and the front encapsulation adhesive film is laid on the cell side of the front plate. The plurality of cells are laid on a surface of the front encapsulation adhesive film, and a relative position of a respective cell is fixed through a corresponding positioning tape. Thereafter, a pre-laminating process is performed, i.e., the front plate and the cells are bonded through the physical or chemical reaction of the front encapsulation adhesive film. A time for the pre-laminating process does not exceed 10 min, such as 2 min, 3 min, 4 min, 5 min, 6 min, 7 min, 8 min, 9 min, or 10 min. A temperature for the pre-laminating process does not exceed 140° ° C., such as 120° ° C., 125° C., 130° C., 135° C., or 140° C. The respective cell at least partially inserts into the front encapsulation adhesive film after the pre-laminating process, but the respective cell is not in contact with the front plate. Thereafter, series connection between cells and between cell strings are realized through solder strips to realize internal series connection. A back encapsulation adhesive film is laid on the cell strings and the back plate is laid on the back encapsulation adhesive film, and finally, the photovoltaic module is encapsulated by laminating the front plate, the plurality of cell strings, the back encapsulation adhesive film, and the back plate that are stacked. A time for the laminating is in a range of 10 min to 20 min, such as, 10 min, 12 min, 14 min, 16 min, 18 min, or 20 min, and a temperature for the laminating is in a range of 140° C. to 160° C., such as 140° ° C., 145° C., 150° C., 155° C., or 160° ° C. It is to be noted that the front encapsulation adhesive film is laid on the cell side of the front plate, and a thickness of the front encapsulation adhesive film after pre-laminating is not less than ½ a thickness of the respective cell. By adopting this scheme, the front encapsulation adhesive film is pre-cured, which can prevent the respective cell from warping due to stress caused by single-side welding, thus avoiding the risk of cracking and fragmentation of the cells, and further improving the yield of photovoltaic modules, and can also shorten the time for the subsequent laminating.

Figure 5:
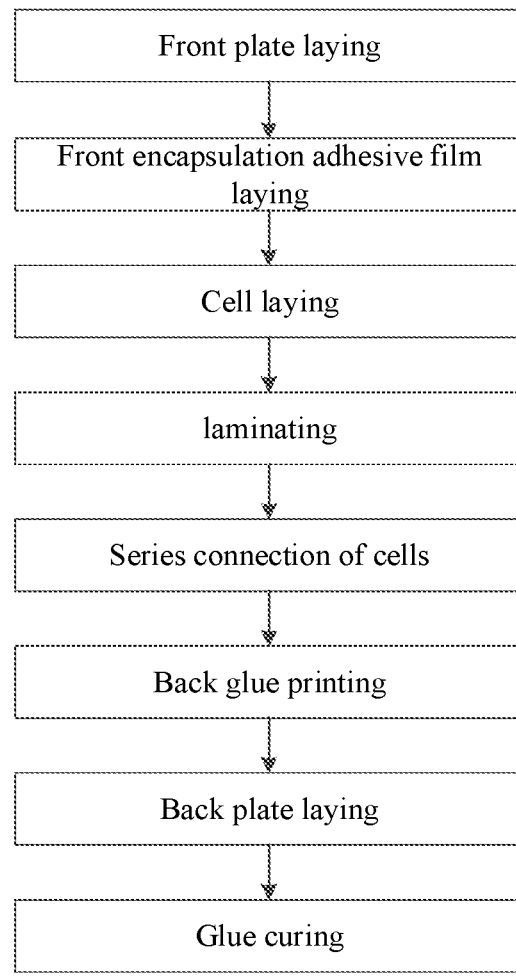
FIG. 5 is a flow chart of a method for manufacturing a photovoltaic module according to other embodiments of the disclosure.

FIG. 5 is a flow chart of a method for manufacturing a photovoltaic module according to other embodiments of the disclosure. As shown in FIG. 5, when the first adhesive layer is an encapsulation adhesive film and the second adhesive layer is glue, during laying normally, the air side of the front plate is facing down, and the front encapsulation adhesive film is laid on the cell side of the front plate. The plurality of cells are laid on a surface of the front encapsulation adhesive film, and a relative position of the respective cell is fixed through a corresponding positioning tape. Thereafter, a laminating process is performed, i.e., the front plate and the cells are bonded through the physical or chemical reaction of the front encapsulation adhesive film. A time for the laminating process is in a range of 20 min to 25 min, such as 20 min, 21 min, 22 min, 23 min, 24 min, or 25 min. A temperature for the laminating process ranges from 140° C. to 160° C., such as 140° ° C., 145° C., 150° C., 155° C., or 160° C. The respective cell at least partially inserts into the front encapsulation adhesive film after the laminating process, but the respective cell is not in contact with the front plate. Series connection between cells and between cell strings are achieved through solder strips to realize internal series connection. Thereafter, a layer of glue is sprayed on the cell strings to ensure that the glue goes over a surface of a respective solder strip. Finally, the back plate is laid on the glue, and encapsulating of the photovoltaic module is completed by photo-curing or thermal-curing. By adopting this scheme, the front encapsulation adhesive film is pre-cured, which can prevent the cell from warping due to stress caused by single-side welding, thus avoiding the risk of cracking and fragmentation of the cells, and further improving the yield of photovoltaic modules.

Figure 6:
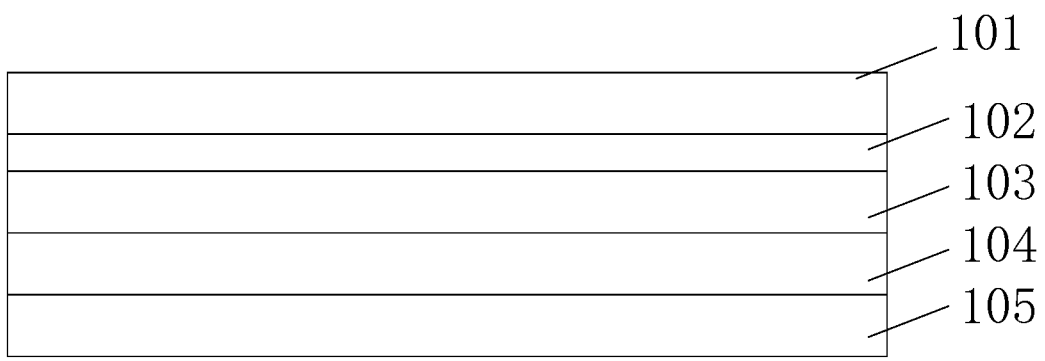
FIG. 6 is a schematic structural diagram of a photovoltaic module according to embodiments of the disclosure.
Figure 7:
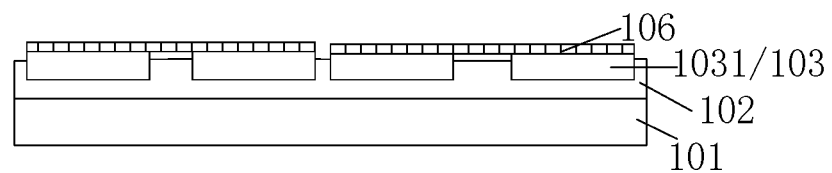
FIG. 7 is a cross-sectional schematic diagram of solder strips, cells, and a first adhesive layer of a photovoltaic module according to embodiments of the disclosure.

FIG. 6 is a schematic structural diagram of a photovoltaic module according to embodiments of the disclosure. FIG. 7 is a cross-sectional schematic diagram of solder strips, cells, and a first adhesive layer according to embodiments of the disclosure. Referring to FIG. 6 and FIG. 7, embodiments of the disclosure provide a photovoltaic module, which is manufactured by the method for manufacturing the photovoltaic module described above. The photovoltaic module includes a front plate 101, a first adhesive layer 102, a plurality of cell strings 103, a second adhesive layer 104, and a back plate 105 that are arranged sequentially. Each cell string 103 includes a plurality of cells 1031, and each two adjacent cells are connected through a plurality of solder strips 106. The front plate 101 can be tempered glass, and the tempered glass has the advantages of high strength, high bending strength, high impact strength, and good safety performance. The back plate 105 can be a polyvinyl fluoride composite film photovoltaic back plate, which is commonly known as a TPT photovoltaic back plate. The TPT photovoltaic back plate has the characteristics of good weather resistance, aging resistance, tear resistance, good air isolation effect, and good insulation. The first adhesive layer 102 and/or the second adhesive layer 104 are glue or adhesive films. A respective cell is a back-contact cell, and solder strips (not shown) are connected to the back of the cells.

When the first adhesive layer is glue or an adhesive film, a thickness of the glue or the adhesive film between the front plate and the plurality of cell strings in a direction perpendicular to a surface of the photovoltaic module ranges from 150 μm to 250 μm.

If the thickness of the glue or the adhesive film between the front plate and the plurality of cell strings is less than 150 μm in the direction perpendicular to the surface of the photovoltaic module, the cell is easy to directly contact the front plate, the cell is prone to breakage. If the thickness of the glue or the adhesive film between the front plate and the plurality of cell strings is greater than 250 μm in the direction perpendicular to the surface of the photovoltaic module, the cost of the photovoltaic module is higher. Therefore, in the direction perpendicular to the surface of the photovoltaic module, the thickness of the glue or the adhesive film between the front plate and the plurality of cell strings ranges from 150 μm to 250 μm, which can not only avoid the risk of breakage of the cells, but also help to reduce the cost of the photovoltaic module. Specifically, when the first adhesive layer is glue or an adhesive film, the thickness of the glue or the adhesive film between the front plate and the plurality of cell strings in the direction perpendicular to the surface of the photovoltaic module can be 150 μm, 180 μm, 210 μm, or 250 μm.

When the second adhesive layer is glue, a thickness of the glue between the back plate and the plurality of cell strings in the direction perpendicular to the surface of the photovoltaic module ranges from 200 μm to 300 μm.

Specifically, if the thickness of the glue between the back plate and the plurality of cell strings in the direction perpendicular to the surface of the photovoltaic module is less than 200 μm, the cell 1031 is easy to contact the back plate 105 directly, and the cell 1031 is easy to break. If the thickness of the glue between the back plate and the plurality of cell strings in the direction perpendicular to the surface of the photovoltaic module is greater than 300 μm, the cost of the photovoltaic module is higher. Therefore, when the second adhesive layer is the glue, the thickness of the glue between the back plate and the plurality of cell strings in the direction perpendicular to the surface of the photovoltaic module ranges from 200 μm to 300 μm, which can not only avoid the risk of breakage of the cells, but also help to reduce the cost of the photovoltaic module. Specifically, when the second adhesive layer is the glue, the thickness of the glue between the back plate and the plurality of cell strings in the direction perpendicular to the surface of the photovoltaic module can be 200 μm, 220 μm, 240 μm, 260 μm, 280 μm, or 300 μm.

When the second adhesive layer is an adhesive film, a thickness of the adhesive film between the back plate and the plurality of cell strings in the direction perpendicular to the surface of the photovoltaic module ranges from 300 μm to 450 μm.

Specifically, if the thickness of the adhesive film between the back plate and the plurality of cell strings is less than 300 μm in the direction perpendicular to the surface of the photovoltaic module, the cell 1031 is easy to directly contact the back plate 105, and the cell 1031 is easy to break. If the thickness of the adhesive film between the back plate and the plurality of cell strings is greater than 450 μm in the direction perpendicular to the surface of the photovoltaic module, the cost of the photovoltaic module is too high. Therefore, when the second adhesive layer is the adhesive film, the thickness of the adhesive film between the back plate and the plurality of cell strings in the direction perpendicular to the surface of the photovoltaic module is designed to be in the range of 300 μm to 450 μm, which can not only avoid the risk of breakage of the cells, but also help to reduce the cost of the photovoltaic module. Specifically, when the second adhesive layer is the adhesive film, the thickness of the adhesive film between the back plate and the plurality of cell strings in the direction perpendicular to the surface of the photovoltaic module may be 300 μm, 330 μm, 360 μm, 390 μm, or 450 μm.

A thickness of the back-contact cell in the direction perpendicular to a surface of the photovoltaic module is in a range of 100 μm to 200 μm. Before curing the glue between the front plate and the plurality of cells, at least half of the thickness of the cell should be covered with glue. For example, a thickness of the glue that goes over the cell accounts for ½ to ¾ of the thickness of the cell.

According to above embodiments, the photovoltaic module provided in the embodiments at least realizes the following beneficial effects.

The photovoltaic module provided in the embodiments is manufactured by the method for manufacturing the photovoltaic module described above, and can prevent the cells from warping due to stress caused by single-side welding by pre-curing the glue and/or the encapsulation adhesive film between the front plate and the plurality of cells, thereby avoiding the risk of cracking and fragmentation of the cells, further improving the yield of the photovoltaic module and reducing the manufacturing cost.

In one embodiment, an area of the glue between the front/back plate and the plurality of cell strings is greater than or equal to a total area of the plurality of cell strings, and/or a size of the adhesive film between the front/back plate and the plurality of cell strings is greater than or equal to the total area of the plurality of cell strings. By adopting the scheme, the area of the glue and/or the size of the adhesive film is greater than or equal to that of the plurality of cell strings, which is more beneficial to the encapsulation of the photovoltaic module.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

While some particular embodiments of the present disclosure have been described in detail by way of example, it will be understood by those skilled in the art that the above examples are for illustration only and are not intended to limit the scope of the present disclosure. It will be understood by those skilled in the art that modifications may be made to the above embodiments without departing from the scope and spirit of the present disclosure. The scope of the disclosure is defined by the appended claims.

What is claimed is:

1. A method for manufacturing a photovoltaic module, comprising:
    laying a front plate, a first adhesive layer on the front plate, and a plurality of cells on the first adhesive layer, and pre-curing the first adhesive layer between the front plate and the plurality of cells;
    fixing a position of a respective cell through a corresponding positioning tape before pre-curing the first adhesive layer;
    forming a plurality of cell strings by connecting the plurality of cells using a plurality of solder strips after the first adhesive layer is pre-cured; and
    laying a second adhesive layer on the plurality of cell strings, laying a back plate on the second adhesive layer, and curing the second adhesive layer between the back plate and the plurality of cell strings, to form the photovoltaic module; wherein
    a time for the pre-curing the first adhesive layer between the front plate and the plurality of cells is shorter than a time for the curing the second adhesive layer between the back plate and the plurality of cell strings.

2. The method of claim 1, wherein at least one of the first adhesive layer and the second adhesive layer is glue or an encapsulation adhesive film.

3. The method of claim 2, wherein laying the front plate, the first adhesive layer on the front plate, and the plurality of cells on the first adhesive layer, pre-curing the first adhesive layer, laying the second adhesive layer on the plurality of cell strings, laying the back plate on the second adhesive layer, and curing the second adhesive layer comprises:
    in response to the first adhesive layer and the second adhesive layer being glue,
        printing the glue on a side of the front plate close to the plurality of cells, laying the plurality of cells on the glue, and pre-curing the glue between the front plate and the plurality of cells; and
        printing the glue on the plurality of cell strings, laying the back plate on the glue, and curing the glue between the plurality of cell strings and the back plate; or in response to the first adhesive layer being glue and the second adhesive layer being the encapsulation adhesive film,
    printing glue on the side of the front plate close to the plurality of cells, laying the plurality of cells on the glue, and pre-curing the glue between the front plate and the plurality of cells; and
    laying a back encapsulation adhesive film on the plurality of cell strings and laying the back plate on the back encapsulation adhesive film, and laminating the front plate, the plurality of cell strings, the back encapsulation adhesive film, and the back plate that are stacked.

4. The method of claim 3, wherein the glue has a thickness in a range of not less than 0.1 mm in a direction perpendicular to the front plate.

5. The method of claim 3, wherein pre-curing the glue between the front plate and the plurality of cells includes heating curing, a temperature for the heating curing ranges from 100° ° C. to 200° C., and a time for the heating curing ranges from 5 min to 30 min.

6. The method of claim 3, wherein pre-curing the glue between the front plate and the plurality of cells includes ultraviolet (UV) curing, wherein the UV curing is performed by using a UV lamp with a wavelength of 365 nm and a curing time for the UV curing is in a range of 1 s to 60 s.

7. The method of claim 3, wherein a time for pre-curing the glue between the front plate and the plurality of cells is shorter than a time for curing the glue between the back plate and the plurality of cell strings.

8. The method of claim 3, wherein a time for laminating the front plate, the plurality of cell strings, the back encapsulation adhesive film, and the back plate that are stacked is in a range of 15 min to 25 min, and a temperature for the laminating ranges from 140° C. to 160° C.

9. The method of claim 2, wherein laying the front plate, the first adhesive layer on the front plate, and the plurality of cells on the first adhesive layer, pre-curing the first adhesive layer, laying the second adhesive layer on the plurality of cell strings, laying the back plate on the second adhesive layer, and curing the second adhesive layer comprises:
    in response to the first adhesive layer and the second adhesive layer being both encapsulation adhesive films,
        laying a front encapsulation adhesive film on a side of the front plate close to the plurality of cells, laying the plurality of cells on the front encapsulation adhesive film, and pre-laminating the front plate, the front encapsulation adhesive film, and the plurality of cells that are stacked; and
        laying a back encapsulation adhesive film on the plurality of cell strings, laying the back plate on the back encapsulation adhesive film, and laminating the front plate, the plurality of cell strings, the back encapsulation adhesive film, and the back plate that are stacked.

10. The method of claim 9, wherein a time for the pre-laminating the front plate, the front encapsulation adhesive film, and the plurality of cells that are stacked is not more than 10 min, and a temperature for the pre-laminating is not more than 140° C.

11. The method of claim 9, wherein a time for the laminating the front plate, the plurality of cell strings, the back encapsulation adhesive film, and the back plate that are stacked is in a range of 10 min to 20 min, and a temperature for the laminating is in a range of 140° ° C. to 160° C.

12. The method of claim 2, wherein laying the front plate, the first adhesive layer on the front plate, and the plurality of cells on the first adhesive layer, pre-curing the first adhesive layer, laying the second adhesive layer on the plurality of cell strings, laying the back plate on the second adhesive layer, and curing the second adhesive layer comprises:
    in response to the first adhesive layer being an encapsulation adhesive film and the second adhesive layer being glue,
        laying a front encapsulation adhesive film on the side of the front plate close to the plurality of cells, laying the plurality of cells on the front encapsulation adhesive film, and laminating the front plate, the front encapsulation adhesive film, and the plurality of cells that are stacked; and
        printing the glue on the plurality of cell strings, laying the back plate on the glue, and curing the glue between the plurality of cell strings and the back plate.

13. The method of claim 12, wherein a time for laminating the front plate, the front encapsulation adhesive film, and the plurality of cells that are stacked is in a range of 20 min to 25 min, and a temperature for the laminating ranges from 140° ° C. to 160° C.

14. The method of claim 1, wherein a thickness of the first adhesive layer after the first adhesive layer is pre-cured is not less than half of a thickness of the respective cell.

* * * * *